(12) United States Patent
Kim

(10) Patent No.: US 9,196,527 B2
(45) Date of Patent: Nov. 24, 2015

(54) FUSE STRUCTURE FOR HIGH INTEGRATED SEMICONDUCTOR DEVICE

(71) Applicant: SK Hynix Inc., Icheon (KR)

(72) Inventor: Hyung Kyu Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 97 days.

(21) Appl. No.: 13/687,332

(22) Filed: Nov. 28, 2012

(65) Prior Publication Data

US 2013/0089976 A1  Apr. 11, 2013

Related U.S. Application Data

(62) Division of application No. 12/650,321, filed on Dec. 30, 2009, now Pat. No. 8,344,476.

(30) Foreign Application Priority Data

Jun. 30, 2009 (KR) .................. 10-2009-0058760

(51) Int. Cl.
  *H01L 21/44* (2006.01)
  *H01L 21/768* (2006.01)
  *H01L 23/525* (2006.01)

(52) U.S. Cl.
  CPC ...... *H01L 21/76877* (2013.01); *H01L 23/5258* (2013.01); *H01L 2924/0002* (2013.01)

(58) Field of Classification Search
  CPC ............ H01L 21/768; H01L 21/76877; H01L 23/525; H01L 23/5256; H01L 23/528
  USPC .......... 257/209, 529, E23.149; 438/132, 215, 438/281, 333, 601
  See application file for complete search history.

(56) References Cited

U.S. PATENT DOCUMENTS

| | | | |
|---|---|---|---|
| 5,672,905 A * | 9/1997 | Lee et al. ................ | 257/529 |
| 2002/0050646 A1* | 5/2002 | Ohhashi ................. | 257/758 |
| 2004/0053487 A1* | 3/2004 | Jeng et al. .............. | 438/601 |
| 2008/0093705 A1* | 4/2008 | Bang et al. ............. | 257/529 |
| 2010/0109122 A1* | 5/2010 | Ding et al. ............. | 257/529 |

FOREIGN PATENT DOCUMENTS

KR  1020090039200 A  4/2009

* cited by examiner

*Primary Examiner* — Colleen A Matthews
*Assistant Examiner* — Colleen E Snow

(57) ABSTRACT

The present invention provides a technology capable of improving an operation reliability of a semiconductor device. Particularly, a fuse material which constitutes the copper can be prevented from migrating being locked in the recesses or the grooves after a blowing process. A semiconductor device includes an insulating layer including a concave-convex-shaped upper part; and a fuse formed on the insulating layer.

14 Claims, 13 Drawing Sheets

FUSE STRUCTURE FOR HIGH INTEGRATED SEMICONDUCTOR DEVICE

CROSS-REFERENCE TO RELATED APPLICATION

The present application is a divisional of U.S. patent application Ser. No. 12/650,321, filed on Dec. 30, 2009, which claims priority based on Korean patent application No. 10-2009-0058760 filed on Jun. 30, 2009, which are incorporated by reference in their entirety.

BACKGROUND OF THE INVENTION

The present invention relates to a semiconductor device, and more specifically, to a fuse included in a highly integrated semiconductor device for restraining the migration of conductive material after a blowing process.

Generally, a fuse is defined as a kind of automatic cut-off device for preventing an overcurrent from continuously flowing through an electric wire. That is, the fuse melts in order to cut the electric wire due to heat generated by an overflow of electricity, i.e., an electric current. Such a fuse can be easily found in common electrical appliances. The fuse allows the electric current to continuously flow at a normal level; however, once the fuse is cut, the electric current is permanently blocked unless the fuse is replaced with a new one. This point differentiates the fuse from a switch capable of controlling the flow of the electric current.

A semiconductor device is designed to operate according to an intended purpose through a process of injecting impurities into a predetermined region within a silicon wafer or depositing new material. A typical example of the semiconductor device is a semiconductor memory device. The semiconductor memory device internally includes many elements such as a transistor, a capacitor, a resistor and the like for performing a determined purpose; and the fuse is one of the elements included therein. The fuse is used in many areas within the semiconductor memory device; a redundancy circuit and a power supply circuit are typical examples of them. The fuse used in such a circuit is kept in a normal state (i.e., unblown state) during a manufacturing process; however, after the manufacturing process, the fuse can be selectively blown (i.e., cut) during a testing process.

Explaining the redundancy circuit in detail, in the case that a particular unit cell is defective in the semiconductor memory device, the defective unit cell is replaced with a redundant cell through a recovering step. That is, an address of the defective unit cell is stored at the recovering step in order to prevent the detective unit cell from being accessed. When an address for accessing the defective unit cell is inputted externally, the redundant cell instead of the defective unit cell is accessed by the redundancy circuit. The fuse of the redundancy circuit is used for storing the address of the defective unit cell at the recovering step by selectively beaming a laser to a corresponding fuse within the semiconductor memory device for blowing the fuse so that an electrically connected point is permanently cut. This work is called a fuse blowing.

In the case of the semiconductor memory device, a plurality of unit cells is included. After the manufacturing process, it cannot be known how many unit cells are defective as well as where the defective unit cell exists among the plurality of unit cells. Therefore, a fuse box including a plurality of fuses is provided within the semiconductor memory device in order to replace the defective unit cells with the redundant cells.

A data storage capacity of the semiconductor memory device is increased more and more. Accordingly, the number of included unit cells is increased and the number of fuses used for replacing the defective unit cell with the redundant normal cell is also increased. On the contrary, the size of the semiconductor memory device is required to decrease for high integration. As above-mentioned, a laser is selectively beamed to a part of the plurality of fuses to be blown. It is well known that a predetermined interval between adjacent fuses should be kept to not influence a neighboring fuse which is not a target of the blowing process. However, this characteristic of the fuse box causes a decrease in the integration of the semiconductor memory device. Accordingly, a technology is required which is capable of preventing unselected fuses from being blown during a blowing process as integration increases without reducing the number of fuses.

FIGS. 1A to 1F are cross-sectional views illustrating a manufacturing method of a fuse included in a conventional semiconductor device.

Referring to FIG. 1A, a nitride layer 104 is formed on an inter-layer dielectric 102; an oxide layer 106 is formed on the nitride layer 104 in order to form a trench where the fuse is to be formed.

Referring to FIG. 1B, after forming a first photo resist pattern 108 on the oxide layer 106, a trench 110 is formed which exposes a part of the inter-layer dielectric 102 by removing exposed oxide layer 106 and nitride layer 104 using the first photo resist pattern 108 as an etching mask.

Referring to FIG. 1C, a metal layer 112 which constitutes the fuse is formed on the trench 110 and the oxide layer 106. At this time, the metal layer 112 includes copper (Cu).

Referring to FIG. 1D, a fuse 114 is formed by performing a Chemical Mechanical Polishing (CMP) process to the metal layer 112 until an upper part of the oxide layer 106 is exposed.

Referring to FIGS. 1E and 1F, after performing a dama cleaning process to exposed parts of the fuse 114 and the oxide layer 106, a nitride layer 116 for protecting the fuse is formed. After depositing a passivation layer 118 on the nitride layer 116, a second photo resist pattern 120 is formed on the passivation layer 118. A feature of the second photo resist pattern 120 is to expose a blowing region of the fuse.

Thereafter, exposed passivation layer 118 is etched using the second photo resist pattern 120 as an etching mask. At this time, all of the passivation layer 118 can be removed to expose the nitride layer 116 formed on the fuse 114, or the passivation layer 118 can remain thinly on the nitride layer 116 according to an energy of a laser used at the blowing process. Thereafter, remaining second photo resist pattern 120 is removed.

FIGS. 2A and 2B are a cross-sectional view and a plan view respectively illustrating problems of the fuse included in the conventional semiconductor device shown in FIGS. 1A to 1F.

Referring to FIG. 2A, it is shown that a blowing region of the fuse 114 is cut after the blowing process. As the fuse 114 is cut, the inter-layer dielectric 102 is exposed under the fuse 114. However, it is shown that a part of metal material which remains on both sides of the blown region moves into the blowing region. Recently, a size and an area of a wire, a fuse and the like included in a high integrated semiconductor device have decreased causing an increase in resistance; therefore, copper (Cu) whose resistance value is low is used. However, copper (Cu) has low strength and high heat conductivity and corrosiveness in comparison with other metal materials. This means residuals generated when the fuse is blown or remaining in the fuse may migrate according to electrical chemical characteristics in a high temperature or high humidity condition.

Referring to FIG. 2B, after a plurality of neighboring fuses 114A to 114D is blown, at a partial fuse (114A), both ends of the fuse are electrically connected due to the migration of the copper (Cu). When the fuse is still electrically connected even though the fuse should be cut by the blowing due to the properties of the copper, an operation stability of the semiconductor device is degraded. Besides, the migration of copper (Cu) damage may be caused to a fuse which should not be blown when its neighboring fuse is blown.

For preventing the above-mentioned fault of thermal degradation or the like, a metal such as aluminum, tungsten or the like whose heat conductivity is relatively low in comparison with copper has been used for manufacturing the fuse. However, in the case of forming the fuse or the wire using these metals, a resistance values is high from a microscopic process, and thus a processing speed may be delayed or a power loss may occur due to a leakage current. Since a size of the fuse of the wire should be increased to overcome this problem, the integration of the semiconductor device is limited consequently. However, as above-mentioned, in the case of forming the fuse using the copper, the fuse formation is difficult due to the properties of the copper. Therefore, a new fuse which is suitable for a highly integrated semiconductor memory device is required.

BRIEF SUMMARY OF THE INVENTION

For overcoming the above-mentioned problems of the prior art, the present invention provides a technology capable of improving an operation reliability of a semiconductor device by forming a fuse by forming a concave-convex insulating layer having a plurality of recesses or grooves at a place where the fuse is to be formed and then depositing a copper on the concave-convex insulating layer so that material which constitutes the copper can be prevented from migrating being locked in the recesses or the grooves after a blowing process.

In accordance with an embodiment of the present invention, there is provided a semiconductor device including an insulating layer including a concave-convex-shaped upper part; and a fuse formed on the insulating layer.

A plurality of recesses formed in parallel on the upper part of the insulating layer in a crossing-direction with a major axis of the fuse. A side of a bottom of the recess is deeper than a center of the bottom so that the bottom of the recess is formed as a convex form. One recess near a blowing region of the fuse among the plurality of recesses has a wider width than the rest. A width of the plurality of recesses becomes wider as they close to a blowing region of the fuse.

A plurality of grooves is formed on an upper part of the insulating layer which corresponds to both sides from a center in a direction of a major axis of the fuse. The plurality of grooves is aligned in a direction of a row and a column, wherein a groove near the blowing region of the fuse has a wider width than the rest. A concave-convex height of the upper part of the insulating layer is about 50% of a thickness of the fuse.

In accordance with another embodiment of the present invention, there is provided a method of manufacturing a semiconductor device, including: forming a plurality of recesses by etching a first insulating layer; depositing a second insulating layer on a structure which includes the plurality of recesses; forming a trench where the plurality of recesses is exposed by etching the second insulating layer; and forming a fuse by filling the trench and the plurality of recesses with conductive material.

The method further comprises depositing a third insulating layer on the inside of the recess and the first insulating layer before depositing the second insulating layer, wherein an etching ratio of the third insulating layer is different from that of the first insulating layer.

DESCRIPTION OF EMBODIMENTS

The present invention relates to a structure of a fuse capable of preventing a thermal degradation of a fuse which neighbors a target fuse during a blowing process. The fuse is formed using copper, even with its migration problems, in order to prevent a processing speed delay or power loss due to a leakage current since a resistance value is increased as a size of the fuse is decreased with increasing integration of a semiconductor device. Particularly, for overcoming a defect due to residuals at a blowing process, an insulating layer of the fuse is formed as a concave-convex shape so that the residuals are prevented from moving by the concave-convex insulating layer.

Hereinafter, embodiments of the present invention are described with reference to the accompanying drawings.

Figure 1A:
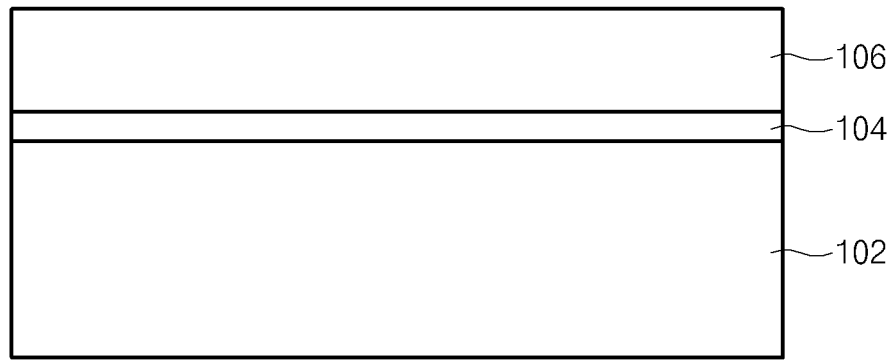
FIGS. 1A to 1F are cross-sectional views illustrating a manufacturing method of a fuse included in a conventional semiconductor device.
Figure 1B:
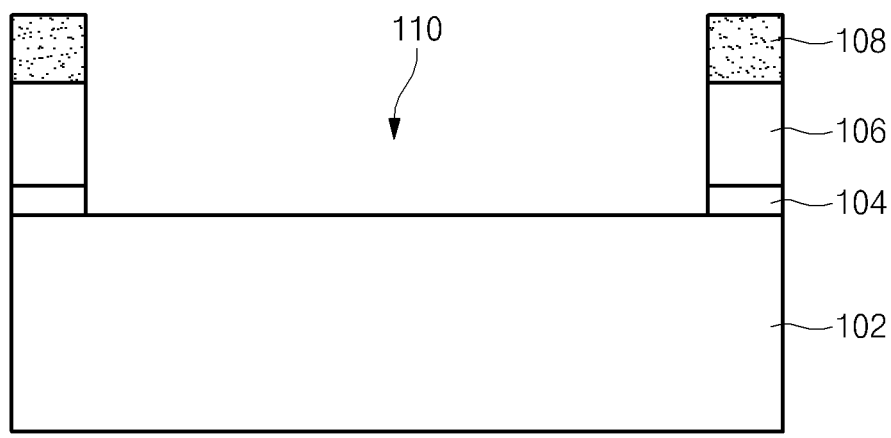
Figure 1C:
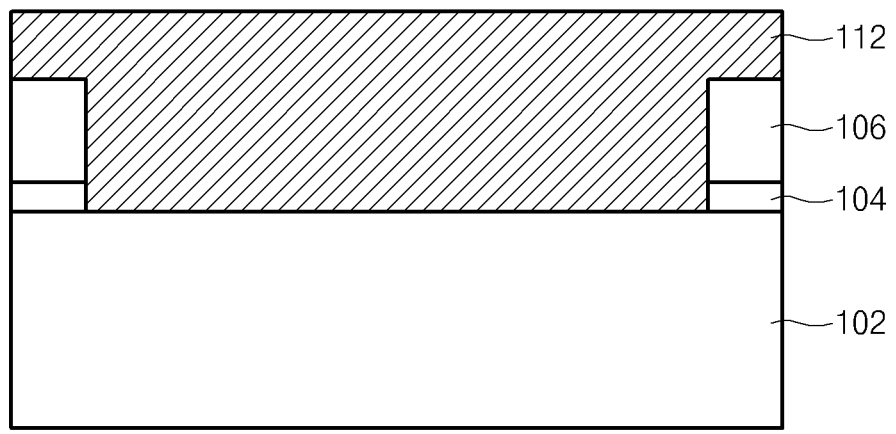
Figure 1D:
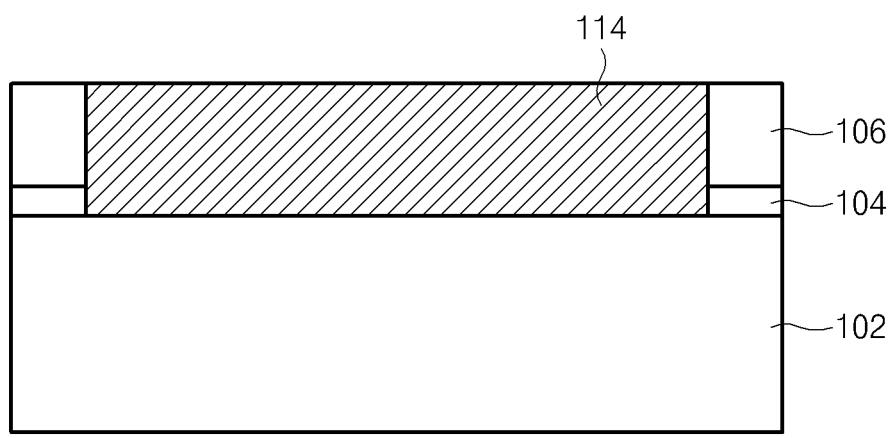
Figure 1E:
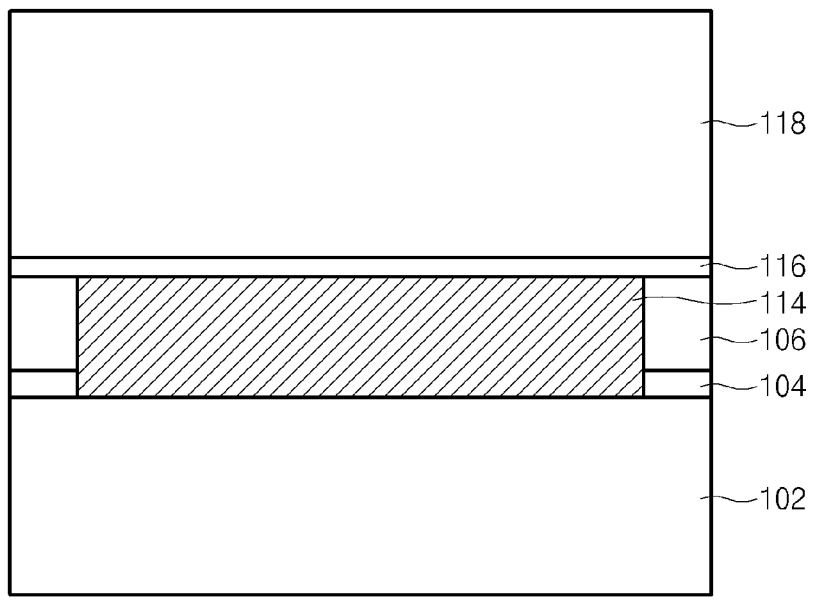
Figure 1F:
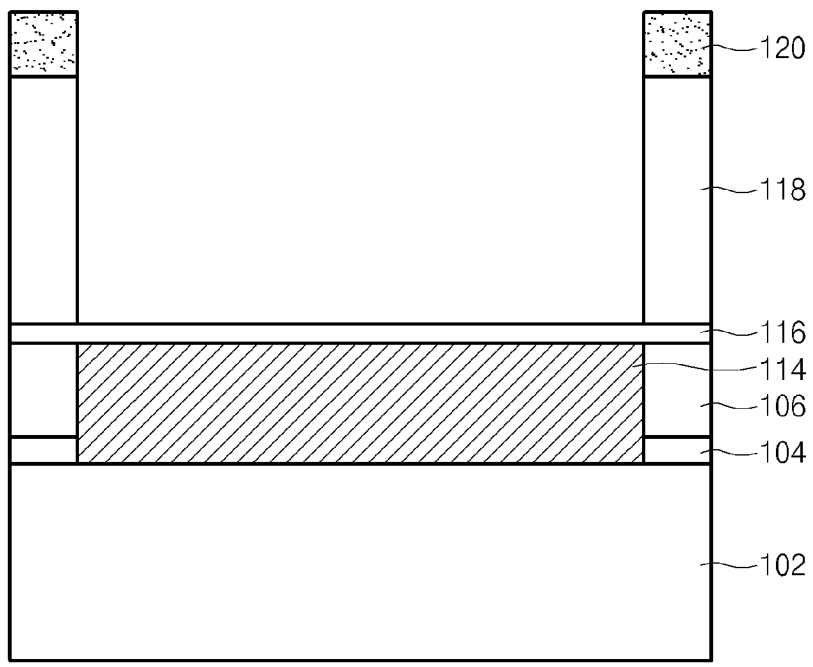
Figure 2A:
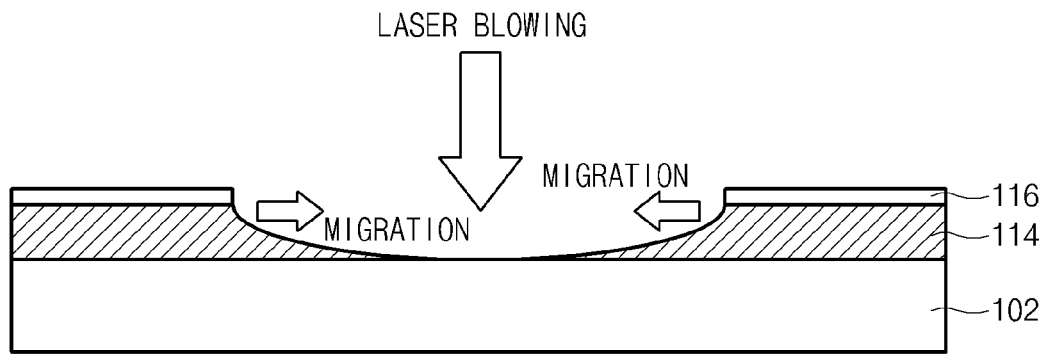
FIGS. 2A and 2B are a cross-sectional view and a plan view respectively illustrating problems of the fuse included in the conventional semiconductor device shown in FIGS. 1A to 1F.
Figure 2B:
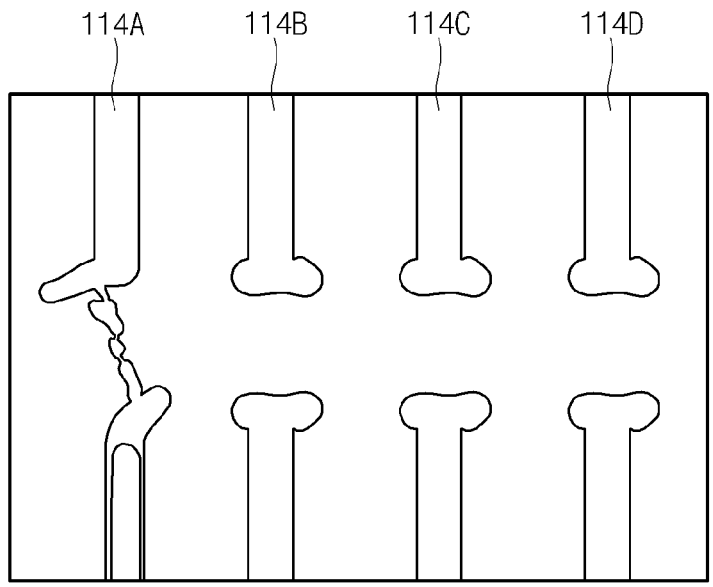
Figure 3A:
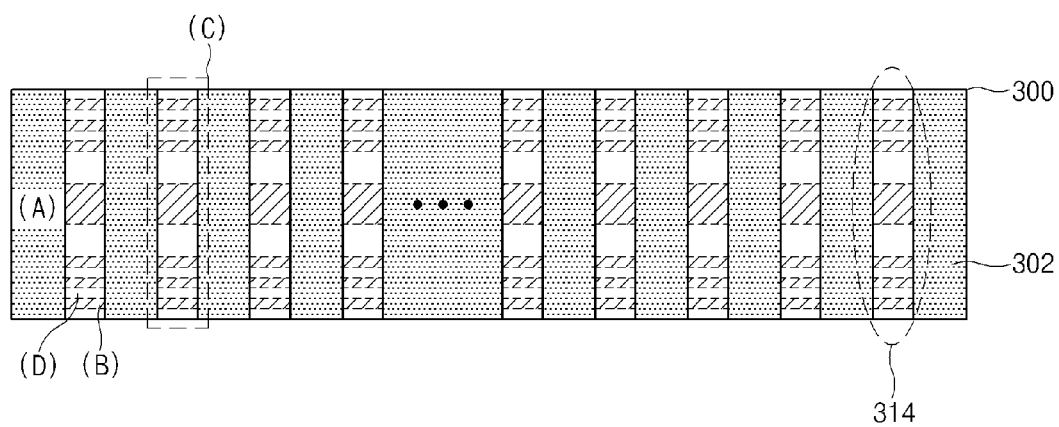
FIGS. 3A to 3C are a plan view and a three-dimensional view illustrating a fuse included in a semiconductor device in accordance with one embodiment of the present invention.
Figure 3B:
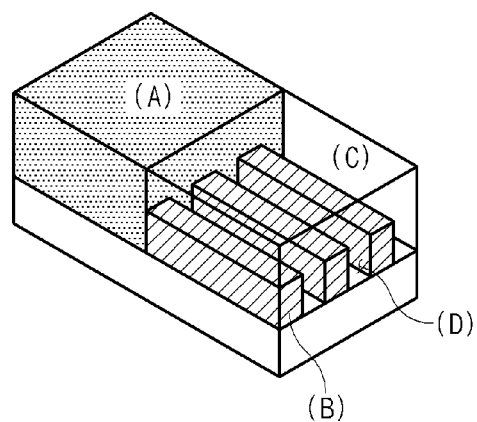
Figure 3C:
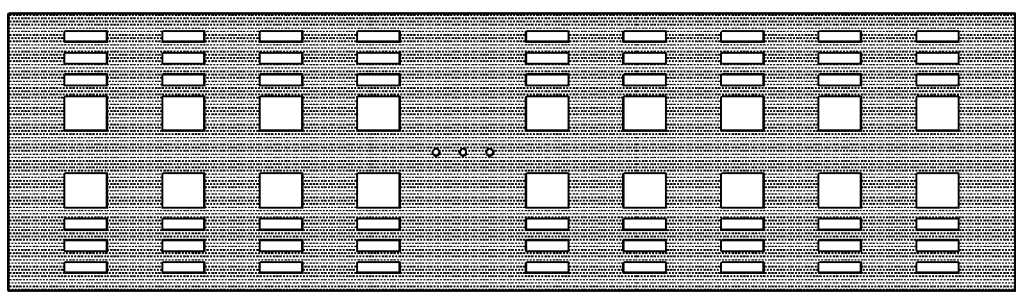

FIGS. 3A to 3C are a plan view and a three-dimensional view illustrating a fuse included in a semiconductor device in accordance with one embodiment of the present invention. In detail, FIG. 3A is a plan view illustrating a fuse box included in the semiconductor device; FIG. 3B is a three-dimensional view illustrating a three-dimensional structure of the fuse shown in FIG. 3A; lastly, FIG. 3C illustrates a mask structure for forming an insulating layer shown in FIG. 3A.

Referring to FIG. 3A, a fuse box 300 in accordance with the embodiment of the present invention includes a plurality of fuses 314, and each fuse 314 is formed on an insulating layer 302 which includes an upper part defines concave and convex portions (hereinafter referred to as "concave-convex upper part.") In one embodiment, the insulating layer 302 includes first and second trenches that define a pillar. Each fuse 314 is electrically separated from a neighboring fuse 314 by the insulating layer 302, and a blowing region is positioned at a center of the fuse 314. A lower part of the fuse 314 is formed concave-convex since the upper part of the insulating layer 302 located under the fuse 314 is formed as a concave-convex form.

Referring to FIG. 3B, the insulating layer 302 includes a region A for electrically insulating a space between neighboring fuses 314; and a concave region D and a convex region B under a space C where the fuse 314 is formed.

Referring to FIGS. 3A and 3B, there exists a plurality of concave regions D under each fuse 314, and these regions are formed perpendicular to a major axis of the fuse 314. However, every concave region D is not formed to the same size, i.e., the concave region D near the blowing region located at the center of the fuse 314 is more largely formed.

FIG. 3C illustrates a structure of a mask for forming the concave region D and the convex region B on the insulating layer 302 formed under the fuse 314.

Referring to FIGS. 3A and 3C, among the concave regions D, two concave regions near the blowing region located near the center of the fuse 314 is more widely formed than the others, and the other concave regions D are formed with similar size to each other. In another embodiment of the present invention the concave regions D may be formed so that the closer the concave region D is to the blowing region of the fuse, the more widely formed the concave region D is. The wide width of the concave region D near the blowing region is for confining conductive material after the blowing process within the concave region D. If the convex region B is located under the blowing region of the fuse 314 and the wide concave region D is formed at its sides, the conductive material can be held within the concave region D after the blowing process even though conductive material moves into the blown region. Therefore the blown fuse can be prevented from being electrically connected over the convex region B. In the case of forming the fuse 314 using a copper (Cu), a step height of the concave region D and the convex region B on the insulating layer 302 (i.e., a concave-convex height of the insulating layer 302) can be 50% of a thickness of the fuse 314 considering the properties of the copper (Cu).

FIGS. 4A to 4H are cross-sectional views illustrating a manufacturing method of the semiconductor device shown in FIG. 3A.

Figure 4A:
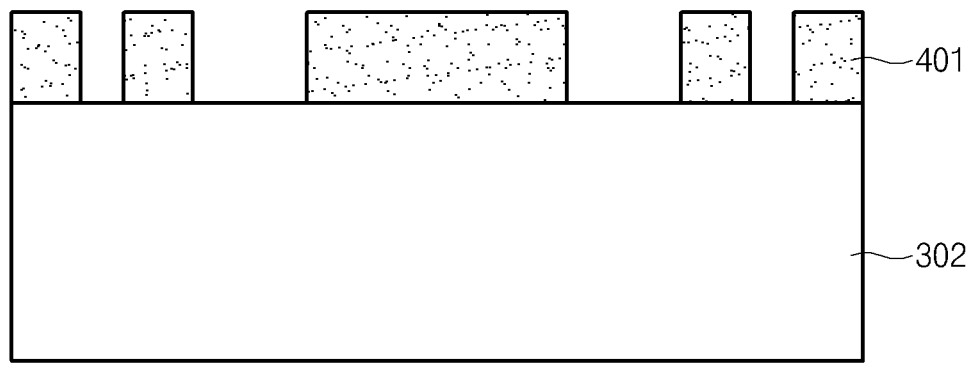
FIGS. 4A to 4H are cross-sectional views illustrating a manufacturing method of the semiconductor device shown in FIG. 3A.

Referring to FIG. 4A, a first photo resist pattern 401 is formed by patterning through a lithography process after applying a photo resist (not shown) on the insulating layer 302.

Figure 4B:
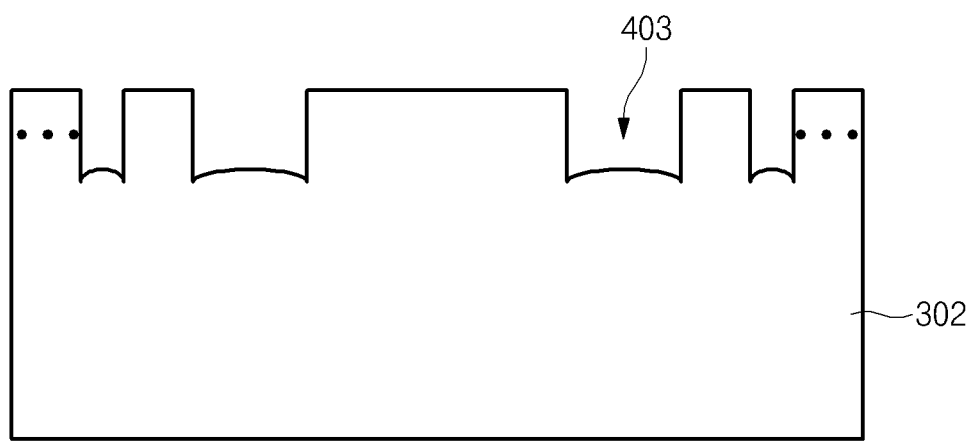

Referring to FIG. 4B, after forming a plurality of recesses (or trenches) 403 by etching an upper part of the insulating layer 302 to a predetermined depth using the first photo resist pattern 401 as an etching mask, remaining first photo resist pattern 401 is removed. Herein, the plurality of recesses 403 corresponds to the concave region D of the insulating layer shown in FIG. 3A and a not-etched region between each recess 403 corresponds to the convex region B.

A depth of the plurality of recesses is about 50% of the fuse 314 thickness to be formed later. In one embodiment, each recess 403 has a convex bottom where a side region is more deeply formed than a center region. The convex shape can be obtained by adjusting the etch condition of the insulating layer 302. The height of the convex bottom may be increased by forming the sides of the recess bottom to be deeper relative to than the center region of the recess bottom, which would enable better trapping of the blown fuse material at the sides of the recess bottom.

Figure 4C:
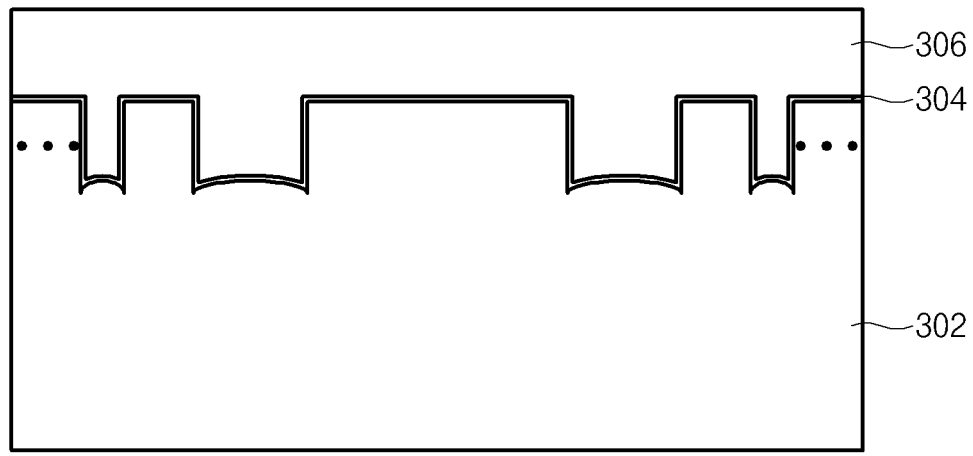

Referring to FIG. 4C, after forming a nitride layer 304 on the insulating layer 302 which includes the plurality of recesses 403, an oxide layer 306 is formed on the nitride layer 304 in order to form a trench where the fuse is to be formed.

Figure 4D:
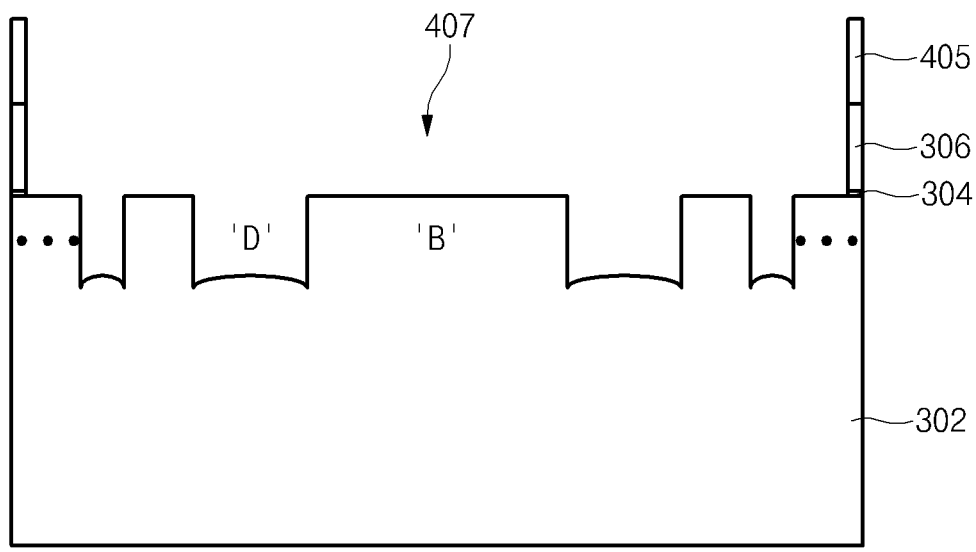

Referring to FIG. 4D, after forming a second photo resist pattern 405 on the oxide layer 306, a trench 407 is forming by removing exposed oxide layer 306 and nitride layer 304 using the second photo resist pattern 405 as the etching mask. At this time, the trench 407 exposes the concave region D and the convex region B formed at the insulating layer 302 through the plurality of recesses 403.

Figure 4E:
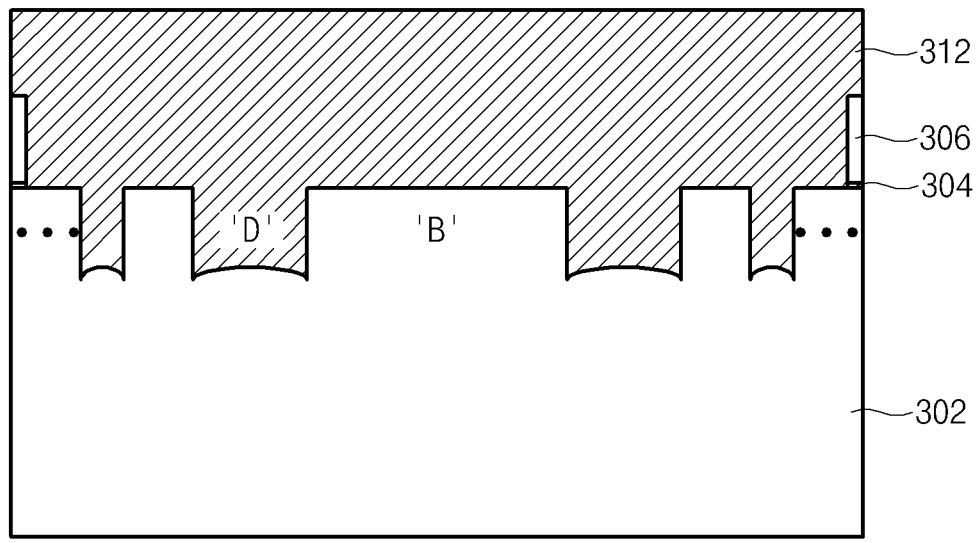

Referring to FIG. 4E, a metal layer 312 which constitutes the fuse is formed on the trench 407 and the oxide layer 306. For instance, the metal layer 312 includes the copper (Cu). Although not shown, a barrier metal layer (not shown) may be formed in the trench 407 composed of the insulating layer 302 and the oxide layer 306 by using material such as TiN before depositing the metal layer 312.

Figure 4F:
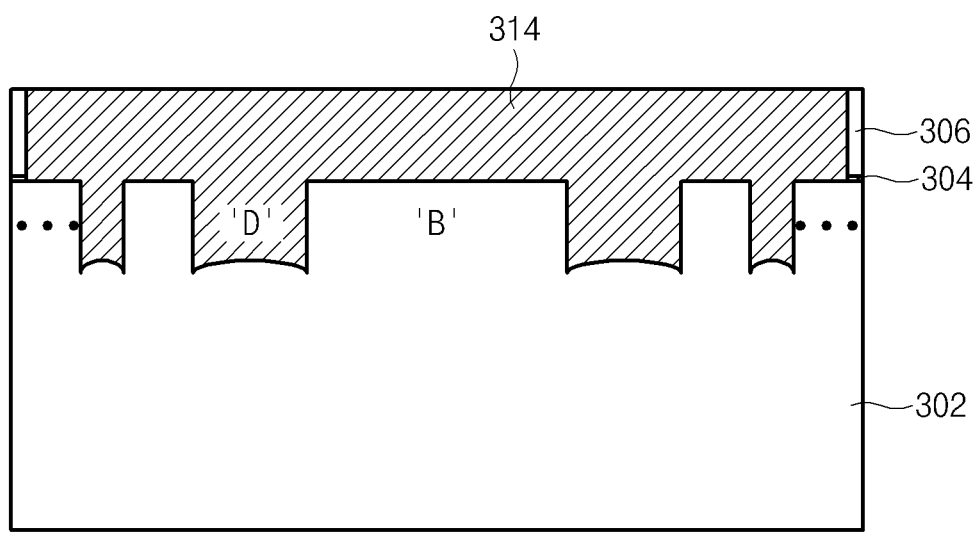

Referring to FIG. 4F, the fuse 314 is formed by performing a Chemical Mechanical Polishing (CMP) process to the metal layer 312 until an upper part of the oxide layer 306 is exposed.

Figure 4G:
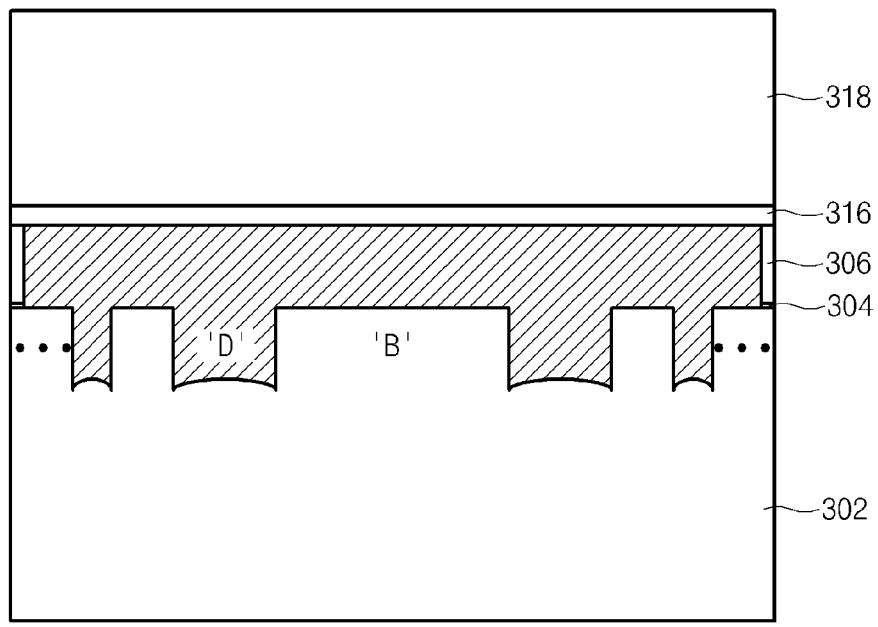

Referring to FIG. 4G, after performing a dama cleaning process to the exposed fuse 314 and the oxide layer 306, a nitride layer 316 for protecting the fuse is formed. A passivation layer 318 is deposited on the nitride layer 316.

Figure 4H:
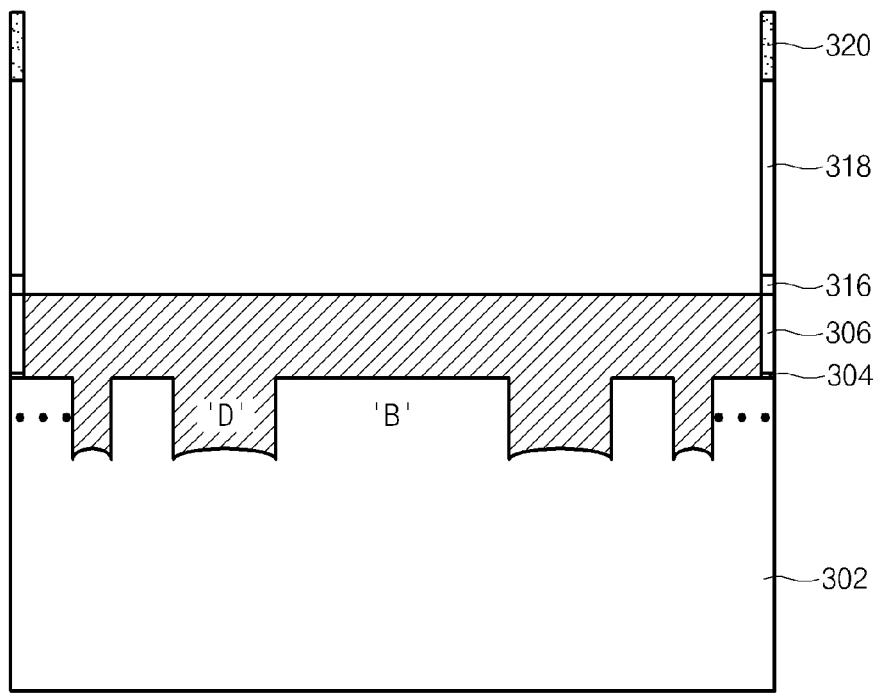

Referring to FIG. 4H, a second photo resist patter 320 is formed on the passivation layer 318. The second photo resist pattern 320 exposes the blowing region of the fuse. Exposed passivation layer 318 is etched using the second photo resist pattern 320 as the etching mask. At this time, all of the passivation layer 318 can be removed to expose the nitride layer 316 formed on the fuse 314, or the passivation layer 318 can remain thinly on the nitride layer 316 according to an energy of a laser used at the blowing process. Thereafter, remaining second photo resist pattern 320 is removed.

Figure 5:
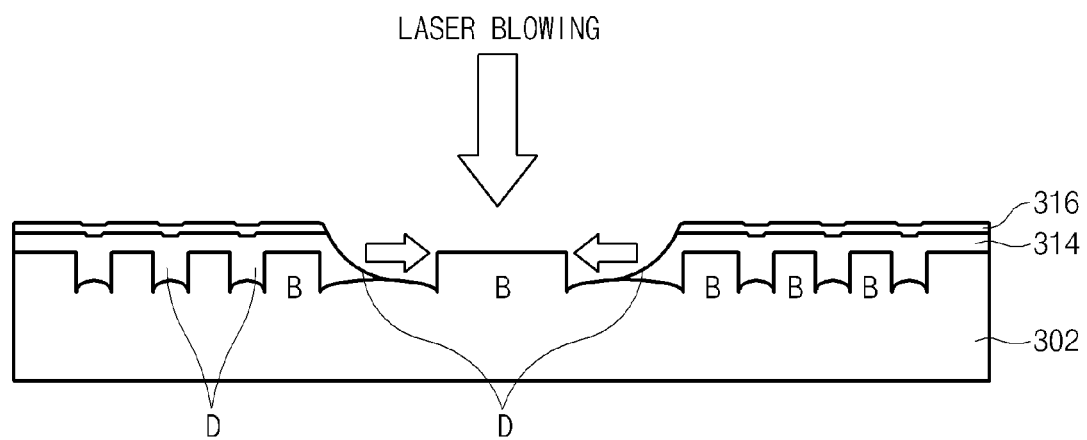
FIG. 5 is a cross-sectional view illustrating a blowing process of the fuse included in the semiconductor device shown in FIG. 3A.

FIG. 5 is a cross-sectional view illustrating the blowing process of the fuse included in the semiconductor device shown in FIG. 3A.

As shown, the blowing region located at the center of the fuse 314 is cut after the blowing process. As the fuse 314 is cut, the insulating layer 302 is exposed under the fuse 314. At this time, even if a portion of remaining metal material at the both sides of the blown region is migrated to the blowing region due to the properties of conductive material such as the copper (Cu), the migrated metal material cannot be electrically connected due to the convex region B formed on the insulating layer 302.

Figure 6A:
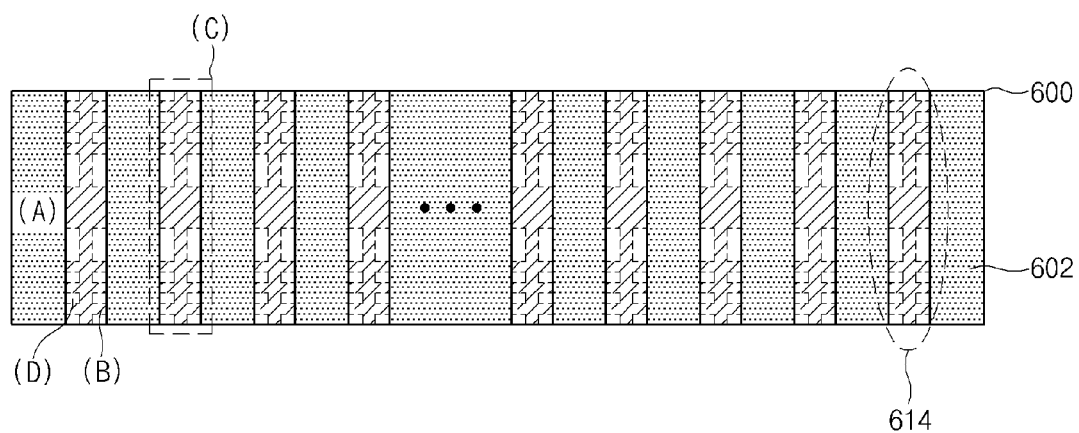
FIGS. 6A to 6C are a plan view and a three-dimensional view illustrating a fuse included in a semiconductor device in accordance with another embodiment of the present invention.
Figure 6B:
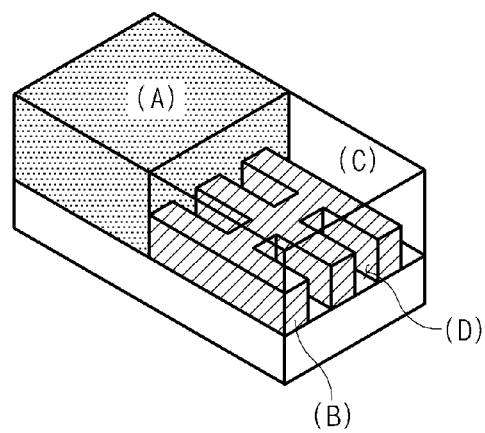
Figure 6C:
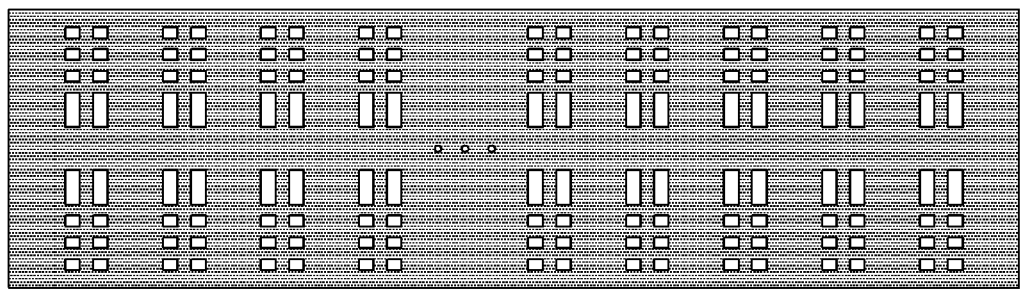

FIGS. 6A to 6C are a plan view and a three-dimensional view illustrating a fuse included in a semiconductor device in accordance with another embodiment of the present invention. In detail, FIG. 6A is a plan view illustrating a fuse box included in the semiconductor device; FIG. 6B is a three-dimensional view illustrating a three-dimensional structure of the fuse shown in FIG. 6A; lastly, FIG. 6C illustrates a mask structure for forming an insulating layer shown in FIG. 6A.

Referring to FIG. 6A, a fuse box 600 in accordance with the embodiment of the present invention includes a plurality of fuses 614, and each fuse 614 is formed on an insulating layer 602 which includes a concave-convex upper part. Unlike the embodiment shown in FIG. 3A, a plurality of grooves D perpendicular to the major axis of the fuse 614 is separated into two halves by a line shaped wall down the major axis of the fuse 614. Herein, the plurality of grooves D near the blowing region of the fuse 614 has a wider width than the rest of the grooves.

Referring to FIG. 6B, the insulating layer 602 includes a region A for electrically insulating a space between neighboring fuses 614; and a concave region D and a convex region B under a space C where the fuse 614 is formed. Unlike the embodiment of FIG. 3B, the convex region B is formed with a center section in the same direction of the major axis of the fuse 614. This convex region B of the insulating layer 602 supports the conductive material which constitutes the fuse 614 after the blowing process so that an amount of conductive material migrated to the blown region can be reduced.

FIG. 6C illustrates a structure of a mask for forming the concave region D and the convex region B on the insulating layer 602 formed under the fuse 614. Unlike the mask shown in FIG. 3C, a line-shaped pattern is included under the major-axis-direction center part of the fuse 614 for the convex region B of the insulating layer 602.

As above-mentioned, in accordance with the embodiment of the present invention, the insulating layer is formed in the concave-convex form under the fuse formed by using a metal such as the copper so that the residuals generated when the fuse is blown are prevented from freely moving due to the concave-convex insulating layer. For this purpose, the semiconductor device in accordance with the embodiment of the present invention includes the insulating layer having a concave-convex upper part; and the fuse formed on the insulating layer.

Explaining the manufacturing method of the semiconductor device in detail, a plurality of recesses are formed by etching a first insulating layer (e.g., nitride layer) and a second insulating layer (e.g., oxide layer) having a different etch ratio from the first insulating layer is deposited on a structure which includes the plurality of recesses, as shown in FIGS. 4B to 4D. Thereafter, by etching the second insulating layer, a trench where the plurality of recesses is exposed is formed; and a fuse is formed by filling the trench and the plurality of recesses formed in a lower part of the trench with conductive material.

Also, in accordance with an embodiment of the present invention, before depositing the second insulating layer, a third insulating layer having a different etching ratio from the first insulating layer is deposited on the inside of the recess and the first insulating layer so that the plurality of recesses can be exposed as it was previously-formed at a later process. The copper (Cu) may be used as material which composes the fuse. In this case, a metal barrier such as TiN can be additionally formed between the copper (Cu) and the insulating layer under the copper (Cu).

In accordance with the present invention, in the case of forming a fuse included in a highly integrated semiconductor device using the copper (Cu), the copper is prevented from moving after the blowing process due to the properties of the copper by the concave-convex pattern formed under the fuse. Therefore, a phenomenon where blown fuses reconnect is prevented and a neighboring fuse is not damaged so that operational stability can be secured.

Further, in accordance with the present invention, even if the fuse is formed using copper, thermal degradation or residuals migration generated during the blowing process can be prevented and the fuse can have a low resistance value. Accordingly, a processing speed delay or power loss due to a leakage current can be prevented.

While the present invention has been described with respect to the specific embodiments, it will be apparent to those skilled in the art that various changes and modifications may be made without departing from the spirit and scope of the invention as defined in the following claims.

What is claimed is:

1. A method of manufacturing a semiconductor device, comprising:
    forming a plurality of first type recesses by etching a first insulating layer provided over a substrate;
    depositing a second insulating layer over the first insulating layer and the plurality of first type recesses;
    forming a second type recess by etching the second insulating layer without etching the first insulating layer, thereby exposing the plurality of first type recesses; and
    after forming the second type recess, forming a fuse in the first and second insulating layers by filling the plurality of first type recesses and the second type recess with a conductive material.

2. The method of manufacturing the semiconductor device according to claim 1, further comprising depositing a third insulating layer on surfaces of the plurality of first type recesses and the first insulating layer before depositing the second insulating layer, wherein an etching rate of the third insulating layer is different from an etching rate of the first insulating layer.

3. The method of manufacturing the semiconductor device according to claim 2, wherein the plurality of first type recesses are symmetrically formed on opposing sides of a major axis of the second type recess.

4. The method of manufacturing the semiconductor device according to claim 3, wherein the plurality of first type recesses are aligned in two directions, and wherein a recess of the plurality of first type recesses near a blowing region of the fuse has a wider width than a recess farther from the blowing region of the fuse.

5. The method of manufacturing the semiconductor device according to claim 1, wherein the plurality of first type recesses are formed in parallel in a direction that crosses a major axis of the second type recess.

6. The method of manufacturing the semiconductor device according to claim 5, wherein a recess of the plurality of first type recesses closer to a blowing region of the fuse has a greater width than a recess of the plurality of first type recesses that is farther from the blowing region of the fuse.

7. The method of manufacturing the semiconductor device according to claim 5, wherein a width of the plurality of first type recesses increases as the plurality of first type recesses approach a blowing region of the fuse.

8. The method of manufacturing the semiconductor device according to claim 1, wherein a depth of the plurality of first type recesses is about 50% of a depth of the second type recess.

9. The method of manufacturing the semiconductor device according to claim 1, further comprising:
    forming a passivation layer over the second insulating layer to expose the fuse.

10. The method of claim 1, wherein forming the plurality of first type recesses includes removing more material from side regions of bottom surfaces of the plurality of first type recesses than center regions of the bottom surfaces.

11. The method of claim 10, wherein the plurality of first type recesses have convex bottom surfaces in which the side regions of the bottom surfaces are deeper than the center regions of the bottom surfaces.

12. A method of manufacturing a semiconductor device, the method comprising:
    forming a first insulation layer over a semiconductor substrate;
    forming a plurality of first recesses in the first insulation layer, each of the plurality of first recesses having a convex bottom surface including a side region which is deeper than a center region;
    forming a second insulation layer over the plurality of first recesses;
    forming a second recess in the second insulation layer exposing the plurality of first recesses; and
    forming a fuse by depositing a conductive material in the plurality of first recess and the second recess.

13. The method of claim 12, further comprising:
    forming a third insulation layer over the plurality of first recesses, wherein forming the second recess includes removing portions of the second and third insulation layers to expose the plurality of first recesses.

14. The method of claim 12, wherein a width of a recess of the plurality of first recesses that is closer to a fuse blowing region of the fuse is greater than a width of a recess of the plurality of first recesses that is farther from the fuse blowing region.

* * * * *